United States Patent
Niemeyer et al.

(10) Patent No.: US 11,947,413 B2
(45) Date of Patent: Apr. 2, 2024

(54) DYNAMIC SYSTEM LOG PREPROCESSING

(71) Applicant: International Business Machines Corporation, Armonk, NY (US)

(72) Inventors: Terry W. Niemeyer, Austin, TX (US); Andrew P. Gellai, Sr., Tucson, AZ (US); Navin Manohar, Cedar Park, TX (US); Lori C. Simcox, Los Gatos, CA (US); Mark A. Sistrunk, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 699 days.

(21) Appl. No.: 16/112,665

(22) Filed: Aug. 25, 2018

(65) Prior Publication Data

US 2020/0065179 A1 Feb. 27, 2020

(51) Int. Cl.
*G06F 11/07* (2006.01)
*G06F 3/06* (2006.01)
*G06F 12/0802* (2016.01)

(52) U.S. Cl.
CPC ........ *G06F 11/0778* (2013.01); *G06F 3/0608* (2013.01); *G06F 3/0641* (2013.01); *G06F 3/0673* (2013.01); *G06F 11/0751* (2013.01); *G06F 12/0802* (2013.01); *G06F 2212/1032* (2013.01)

(58) Field of Classification Search
CPC ............. G06F 11/0778; G06F 11/0751; G06F 3/0608; G06F 3/0641; G06F 3/0673; G06F 12/0802; G06F 2212/1032
See application file for complete search history.

(56) References Cited

U.S. PATENT DOCUMENTS

| | | | |
|---|---|---|---|
| 5,596,712 A | 1/1997 | Tsuyama et al. | |
| 6,249,755 B1 | 6/2001 | Yemini et al. | |
| 7,467,113 B2 | 12/2008 | McFarlin et al. | |
| 7,685,092 B2 | 3/2010 | Reichert et al. | |
| 9,996,545 B1 * | 6/2018 | Goldberg | G06K 7/1404 |
| 2003/0156874 A1 * | 8/2003 | Parry | G06F 9/4411 |
| | | | 400/74 |

(Continued)

OTHER PUBLICATIONS

Sileika, "Performing Complex Searches and Reporting on Application Log Files." Pro Python System Administration. Apress, Berkeley, CA, Nov. 2014. pp. 189-215.

(Continued)

*Primary Examiner* — Kamini B Patel
(74) *Attorney, Agent, or Firm* — Stephen R. Yoder

(57) ABSTRACT

A method for more effectively recording information in system logs is disclosed. In one embodiment, such a method includes detecting errors on a system such as a host system or storage system over a specified period of time. The method stores information associated with the errors in a memory buffer. The method further preprocesses the information in the memory buffer to condense the information and remove duplication. In certain embodiments, this preprocessing includes grouping errors by error type and providing a single stack trace or other information per error type. The method then outputs the preprocessed information to a log file. A corresponding system and computer program product are also disclosed.

20 Claims, 5 Drawing Sheets

(56) References Cited

U.S. PATENT DOCUMENTS

| | | | | |
|---|---|---|---|---|
| 2010/0077013 | A1* | 3/2010 | Clements | G06F 16/1748 |
| | | | | 707/822 |
| 2010/0235494 | A1* | 9/2010 | Sood | H04L 67/22 |
| | | | | 709/224 |
| 2011/0145659 | A1 | 6/2011 | Ikeyama | |
| 2013/0263071 | A1* | 10/2013 | Malik | G06F 30/00 |
| | | | | 716/106 |
| 2015/0074685 | A1* | 3/2015 | Baeuerle | G06F 11/0706 |
| | | | | 719/318 |
| 2017/0168917 | A1* | 6/2017 | Doi | G06F 11/3636 |
| 2017/0214605 | A1* | 7/2017 | Astigarraga | H04L 45/22 |
| 2019/0370088 | A1* | 12/2019 | Chen | G06F 9/542 |

OTHER PUBLICATIONS

Wood, "Logging, Auditing and Filtering for Internet Electronic Commerce." Computer Fraud & Security, Elsevier Science Ltd., Aug. 1997, pp. 11-16.

Han, et al., "Managing Exceptions in the Medical Workflow Systems." Proceedings of the 28th international conference on Software engineering. May 2006, pp. 741-750.

Attanasio, "An Internal Tracer for CP/67," IBM Thomas J. Watson Research Center, RC 2784, Feb. 1970.

Hassani, "Studying and Detecting Log-related Issues," A Thesis in The Department of Computer Science and Software Engineering, Concordia University, Montreal, Quebec, Canada, Mar. 2018.

Basques, Kayce; What's New in DevTools (Chrome64)—Group Similar Console Messages; https://developers.google.com/web/updates/2017/11/devtools-release-notes#/group-similar; 17 pages, lasted updated Mar. 2020.

* cited by examiner

DYNAMIC SYSTEM LOG PREPROCESSING

BACKGROUND

Field of the Invention

This invention relates to systems and methods for more effectively recording information in system logs.

Background of the Invention

In complex computing systems, such as host systems and/or storage systems, activity and error conditions are frequently recorded in log and trace files. These log and trace files may provide an audit trail that may be used to understand the activity of the system and to diagnose problems. When unexpected or exceptional conditions occur in such complex computing systems, a large number of error events may be generated in a very short amount of time. Each of these error events, as well as information gathered in association with the error events, may be recorded in the log and trace files. In addition to generating a large amount of potentially redundant information that needs to be stored, this may cause various problems.

For example, storing a significant amount of information in log files in a short amount of time may cause log files to roll over too quickly to catch some relevant information that may be needed. The log files themselves may also be difficult to read and understand, particularly when they are filled with duplicate entries and stack traces for the same error condition. In addition, throwing and logging so many error conditions may impact performance of a system such as a host or storage system. In some cases, it may cause operating code associated with the system to reboot or restart. In certain instances, because notifications may be turned off, disabled, or not supported, a user may be unaware of the large number of error events that are being generated and logged by the system. This may prolong negative system impacts and prevent corrective actions from being taken by the user.

In view of the foregoing, what are needed are systems and methods to more effectively record information in system logs. Ideally, such systems and methods will prevent log files from rolling over too often. Further needed are systems and methods to make log files easier to read and understand, and to prevent or reduce impacts to system performance caused by throwing and logging significant numbers of errors.

SUMMARY

The invention has been developed in response to the present state of the art and, in particular, in response to the problems and needs in the art that have not yet been fully solved by currently available systems and methods. Accordingly, systems and methods have been developed to more effectively record information in system logs. The features and advantages of the invention will become more fully apparent from the following description and appended claims, or may be learned by practice of the invention as set forth hereinafter.

Consistent with the foregoing, a method for more effectively recording information in system logs is disclosed. In one embodiment, such a method includes detecting errors on a system such as a host system or storage system over a specified period of time. The method stores information associated with the errors in a memory buffer. The method further preprocesses the information in the memory buffer to condense the information and remove duplication. In certain embodiments, this preprocessing includes grouping errors by error type and providing a single stack trace or other information per error type. The method then outputs the preprocessed information to a log file.

A corresponding system and computer program product are also disclosed and claimed herein.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the embodiments of the invention will be described and explained with additional specificity and detail through use of the accompanying drawings, in which.

DETAILED DESCRIPTION

Figure 1:
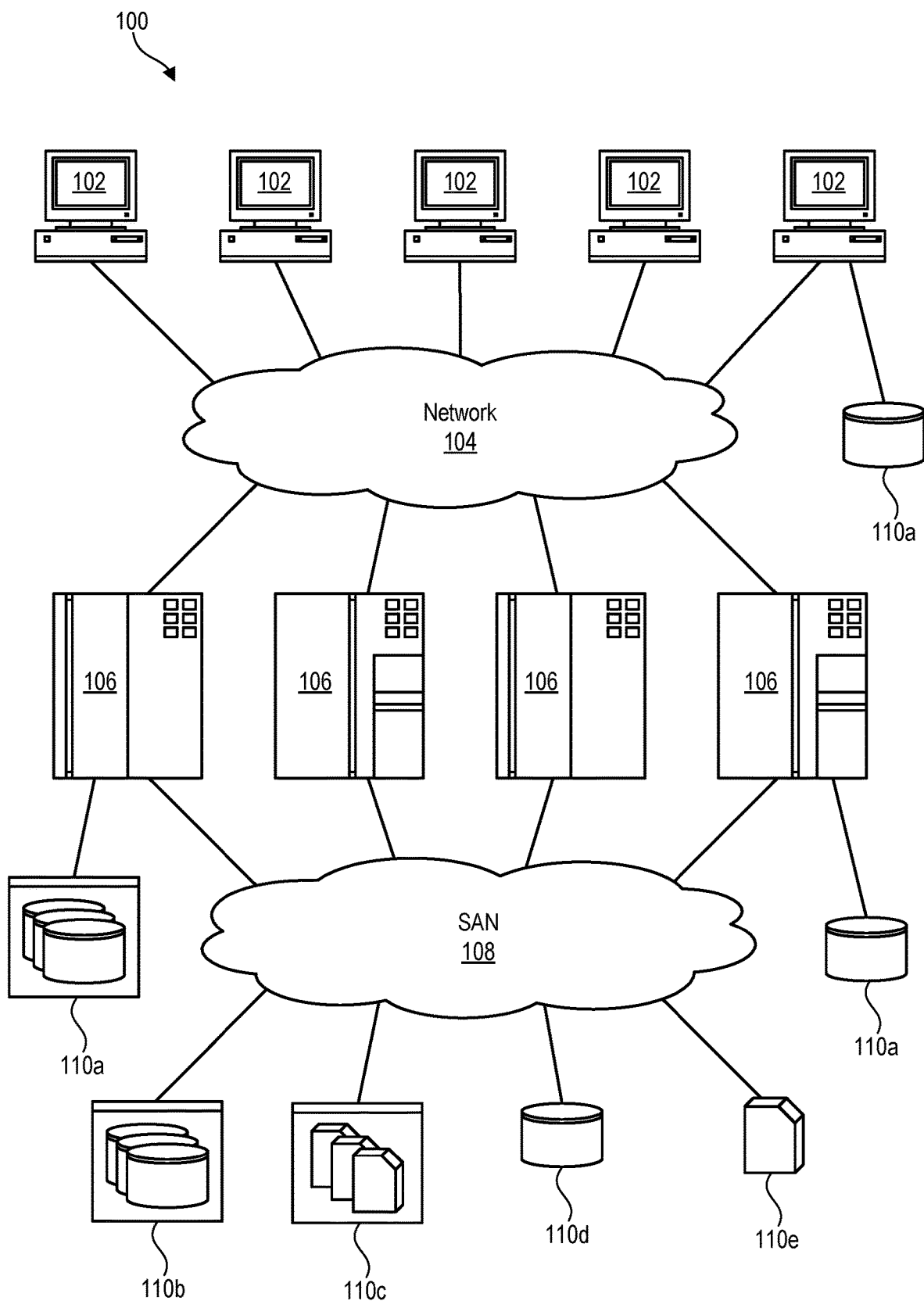
FIG. 1 is a high-level block diagram showing one example of a network environment in which systems and methods in accordance with the invention may be implemented.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The present invention may be embodied as a system, method, and/or computer program product. The computer program product may include a computer readable storage medium (or media) having computer readable program instructions thereon for causing a processor to carry out aspects of the present invention.

The computer readable storage medium may be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++, or the like, and conventional procedural programming languages, such as the "C" programming language or similar programming languages.

The computer readable program instructions may execute entirely on a user's computer, partly on a user's computer, as a stand-alone software package, partly on a user's computer and partly on a remote computer, or entirely on a remote computer or server. In the latter scenario, a remote computer may be connected to a user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, may be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

Referring to FIG. 1, one example of a network environment 100 is illustrated. The network environment 100 is presented to show one example of an environment where systems and methods in accordance with the invention may be implemented. The network environment 100 is presented by way of example and not limitation. Indeed, the systems and methods disclosed herein may be applicable to a wide variety of different network environments, in addition to the network environment 100 shown.

As shown, the network environment 100 includes one or more computers 102, 106 interconnected by a network 104. The network 104 may include, for example, a local-area-network (LAN) 104, a wide-area-network (WAN) 104, the Internet 104, an intranet 104, or the like. In certain embodiments, the computers 102, 106 may include both client computers 102 and server computers 106 (also referred to herein as "host systems" 106). In general, the client computers 102 initiate communication sessions, whereas the server computers 106 wait for and respond to requests from the client computers 102. In certain embodiments, the computers 102 and/or servers 106 may connect to one or more internal or external direct-attached storage systems 110*a* (e.g., arrays of hard-disk drives, solid-state drives, tape drives, etc.). These computers 102, 106 and direct-attached storage systems 110*a* may communicate using protocols such as ATA, SATA, SCSI, SAS, Fibre Channel, or the like.

The network environment 100 may, in certain embodiments, include a storage network 108 behind the servers 106, such as a storage-area-network (SAN) 108 or a LAN 108 (e.g., when using network-attached storage). This network 108 may connect the servers 106 to one or more storage systems, such as arrays 110*b* of hard-disk drives or solid-state drives, tape libraries 110*c*, individual hard-disk drives 110*d* or solid-state drives 110*d*, tape drives 110*e*, virtual tape systems, CD-ROM libraries, or the like. To access a storage system 110, a host system 106 may communicate over physical connections from one or more ports on the host 106 to one or more ports on the storage system 110. A connection may be through a switch, fabric, direct connection, or the like. In certain embodiments, the servers 106 and storage systems 110 may communicate using a networking standard such as Fibre Channel (FC).

Figure 2:
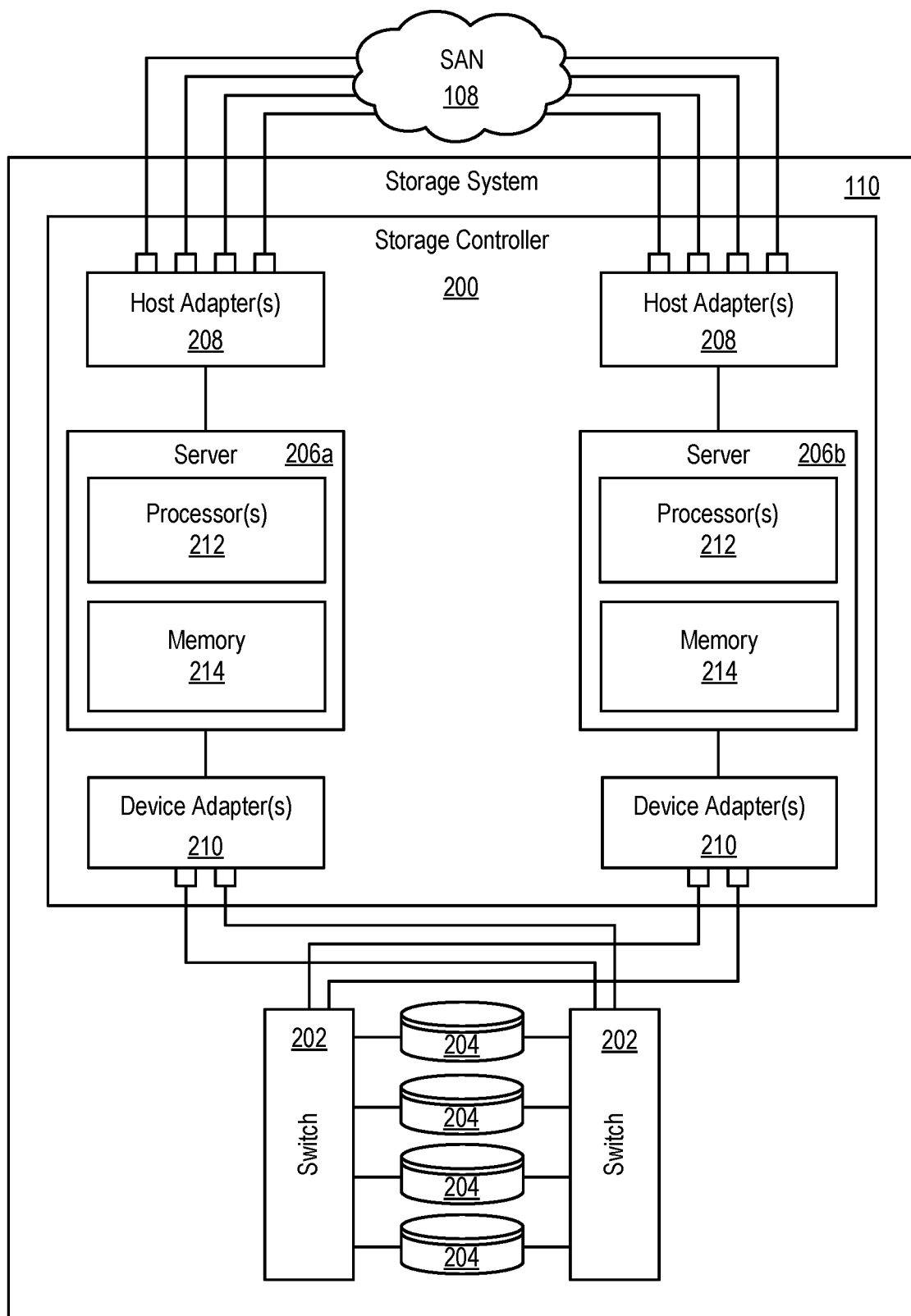
FIG. 2 is a high-level block diagram showing one example of a storage system in the network environment of FIG. 1.

Referring to FIG. 2, one embodiment of a storage system 110 containing an array of hard-disk drives 204 and/or solid-state drives 204 is illustrated. As shown, the storage system 110 includes a storage controller 200, one or more switches 202, and one or more storage drives 204, such as hard disk drives 204 or solid-state drives 204 (such as flash-memory-based drives 204). The storage controller 200 may enable one or more hosts 106 (e.g., open system and/or mainframe servers 106 running operating systems such z/OS, zVM, or the like) to access data in the one or more storage drives 204.

In selected embodiments, the storage controller 200 includes one or more servers 206. The storage controller 200 may also include host adapters 208 and device adapters 210 to connect the storage controller 200 to host devices 106 and storage drives 204, respectively. Multiple servers 206a, 206b may provide redundancy to ensure that data is always available to connected hosts 106. Thus, when one server 206a fails, the other server 206b may pick up the I/O load of the failed server 206a to ensure that I/O is able to continue between the hosts 106 and the storage drives 204. This process may be referred to as a "failover."

In selected embodiments, each server 206 may include one or more processors 212 and memory 214. The memory 214 may include volatile memory (e.g., RAM) as well as non-volatile memory (e.g., ROM, EPROM, EEPROM, hard disks, flash memory, etc.). The volatile and non-volatile memory may, in certain embodiments, store software modules that run on the processor(s) 212 and are used to access data in the storage drives 204. These software modules may manage all read and write requests to logical volumes in the storage drives 204.

One example of a storage system 110 having an architecture similar to that illustrated in FIG. 2 is the IBM DS8000™ enterprise storage system. The DS8000™ is a high-performance, high-capacity storage controller providing disk storage that is designed to support continuous operations. Nevertheless, the systems and methods disclosed herein are not limited to operation with the IBM DS8000™ enterprise storage system 110, but may operate with any comparable or analogous storage system 110, regardless of the manufacturer, product name, or components or component names associated with the system 110. Furthermore, any storage system that could benefit from one or more embodiments of the invention is deemed to fall within the scope of the invention. Thus, the IBM DS8000™ is presented by way of example and is not intended to be limiting.

Figure 3:
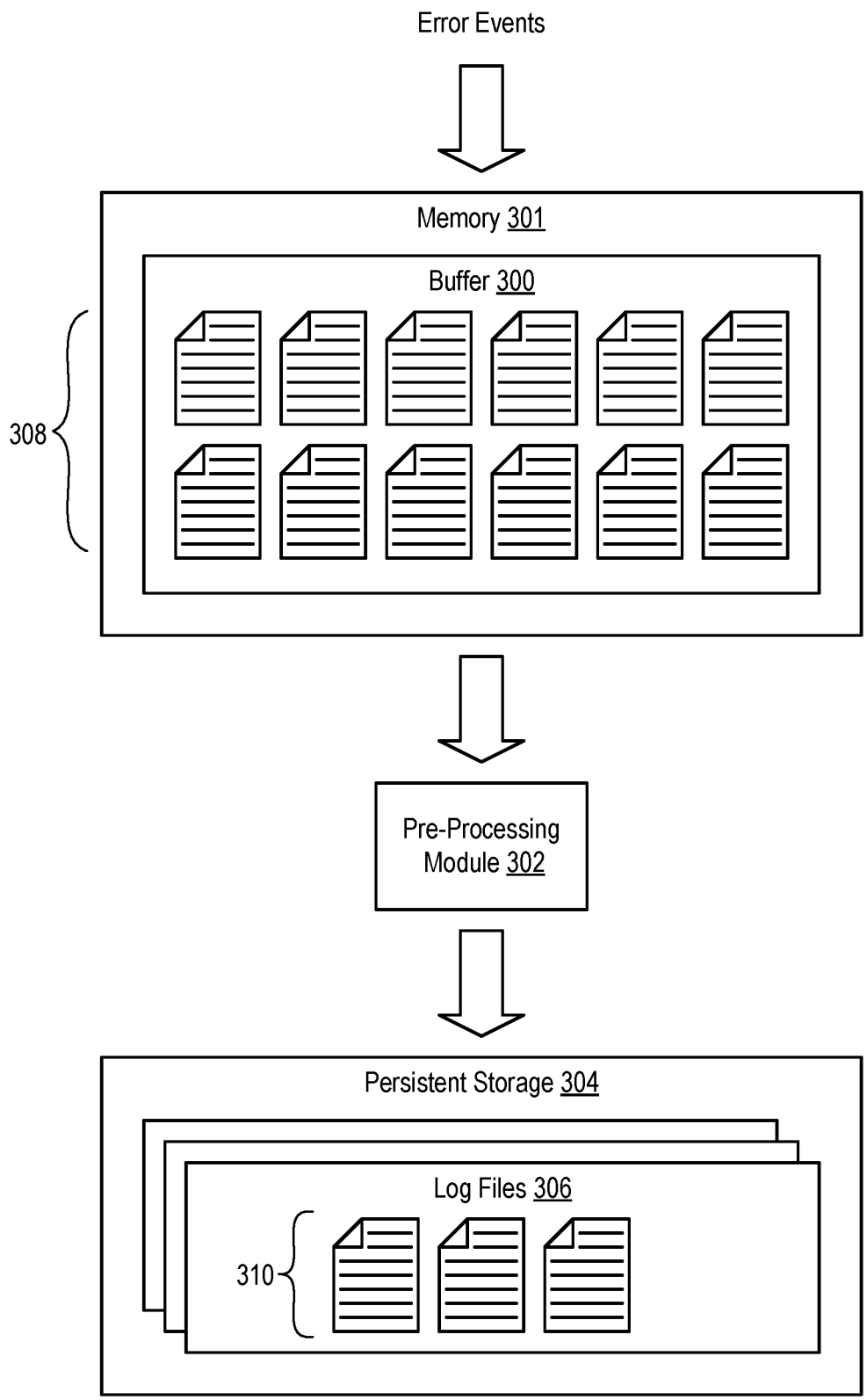
FIG. 3 is a high-level block diagram showing one embodiment of a system for more effectively recording information in system logs.

Referring to FIG. 3, as previously mentioned, in complex computing systems, such as the host systems 106 and/or storage systems 110 discussed in FIGS. 1 and 2, activity and error conditions are frequently recorded in log and trace files 306. These log and trace files 306 may provide an audit trail that may be used to understand the activity of the system and to diagnose problems. When unexpected or exceptional conditions occur in such complex computing systems, a large number of error events may be generated in a very short period of time. Each of these error events, as well as information gathered in association with the error events, may be recorded in the log and trace files 306. In addition to generating a large amount of potentially redundant information that needs to be stored, this may cause various problems.

For example, storing a significant amount of information in log files 306 in a short amount of time may cause log files 306 to roll over too quickly to catch some relevant information that may be needed. The log files 306 themselves may also be difficult to read and understand, particularly when they are filled with duplicate entries and stack traces for the same error condition. In addition, throwing and logging so many error conditions may impact the performance of a system such as a host system 106 or storage system 110. In some cases, it may cause operating code associated with the system to reboot or restart. In certain cases, because notifications may be turned off, disabled, or not supported, a user may be unaware of the large number of error events that are being generated and logged by the system. This may prolong negative system impacts and prevent corrective action from being taken by the user.

In order to address the problems and issues set forth above, systems and methods in accordance with the invention may be provided to more effectively record information in system logs. Such systems and methods will ideally prevent log files 306 from rolling over (i.e., starting a new file) too often. Further needed are systems and methods to make log files 306 easier to read and understand, and to prevent or reduce impacts to system performance caused by throwing and logging significant numbers of errors.

FIG. 3 is a high-level block diagram showing one embodiment of such a system. In general, instead of directly recording information associated with error events in a log file 306, uncondensed error events 308 and associated information 308 (e.g., traces such as stack traces, etc.) may be initially stored in a buffer 300 in memory 301 (which may be, in certain embodiments, the memory 214 illustrated in FIG. 2). These error events 308 may be gathered in the buffer 300 for some designated period of time. A preprocessing module 302 may then process the error events and associated information in the buffer 300 to condense the information and remove duplication. After this preprocessing step, the condensed error events 310 and associated information 310 may be stored in log files 306 implemented in more persistent storage 304, such as hard disk drives or solid state drives. The preprocessing module 302 may make the log files 306 easier to read as well reduce the size of data that is stored in the log files 306. Is may also reduce the amount of storage capacity consumed by the log files 306 and reduce reads and writes to the log file 306. Because the size of data in the log files 306 is reduced, this may reduce the frequency that log files 306 are rolled over.

Figure 4:
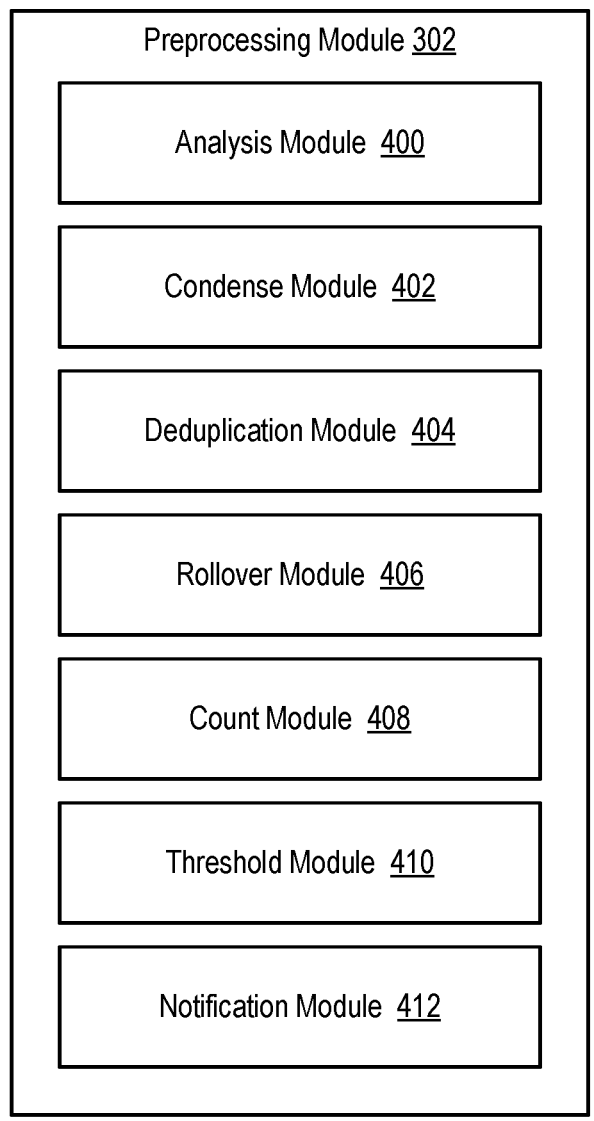
FIG. 4 is a high-level block diagram showing various internal sub-modules within a preprocessing module in accordance with the invention.

Referring to FIG. 4, a high-level block diagram showing the preprocessing module 302 and associated sub-modules is illustrated. The preprocessing module 302 and associated sub-modules may be implemented in hardware, software, firmware, or combinations thereof. The preprocessing module 302 and associated sub-modules are presented by way of example and not limitation. More or fewer sub-modules may be provided in different embodiments. For example, the functionality of some sub-modules may be combined into a single or smaller number of sub-modules, or the functionality of a single sub-module may be distributed across several sub-modules. As shown, the preprocessing module 302 includes one or more of an analysis module 400, condense module 402, deduplication module 404, rollover module 406, count module 408, threshold module 410, and notification module 412.

As previously mentioned, instead of directly recording information associated with error events in a log file 306, these error events 308 and associated information 308 may be stored in an intermediate location such as a buffer 300. In certain embodiments, these error events and associated information may accumulate in the buffer 300 for a designated period of time. After this period of time, the analysis module 400 may analyze the contents of the buffer 300 to determine how the contents may be represented in a more efficient and comprehensible manner. This may occur prior to writing the error information to a log file 306.

To represent error information in a more efficient and comprehensible manner, for example, the condense module 402 may condense the contents of the buffer 300 such as by extracting only the most useful information, or eliminating extraneous, unessential, or unimportant information. Similarly, the deduplication module 404 may eliminate duplicate information. For example, if the same type of error occurs multiple times and lists the same information each time it occurs, the deduplication module 404 may eliminate or reduce the redundancy. In certain embodiments, redundant errors may be grouped by type and replaced by a single instance of information and a count indicating how many times the error has occurred, and potentially a timestamp for each time the error occurred. Other techniques for eliminating or reducing redundancy are also possible and within the scope of the invention.

The rollover module 406 may take into account file rollover when writing error events to log files 306. For example, if a group of errors of the same type is being written to the log files 306, redundant information associated with the group of errors may be eliminated as long as it resides within the same log file 306. If the error information spans multiple log files 306, the rollover module 406 may provide a complete set of information in each log file 306.

When multiple errors of the same type have occurred, the count module 408 may maintain a count for the error type. The threshold module 410 may determine when this count reaches a threshold value. When the count reaches the threshold value, the notification module 412 may automatically notify a user through an alert on a graphical user interface (GUI) or, alternatively, through a Call Home event. The alert may grab the user's attention and notify him or her that significant events have occurred on the system. The Call Home event, by contrast, may relay information back to a vendor or external service provider associated with the system so that the vendor or external service provider may take appropriate corrective action. If the Call Home feature is not enabled, an alert may recommend that a user enable the feature to report the error conditions occurring on the system.

Figure 5:
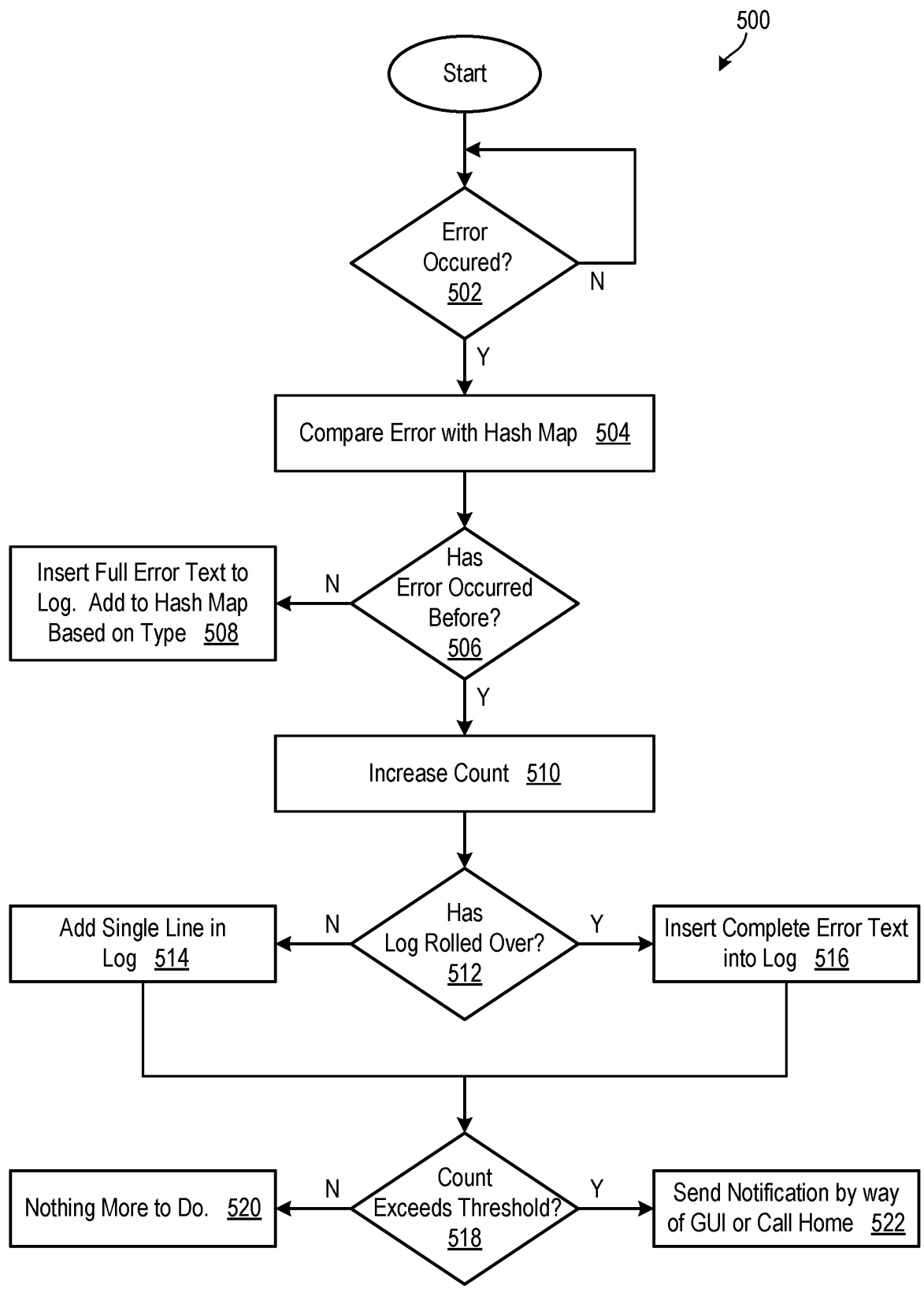
FIG. 5 is a process flow diagram showing one embodiment of a method for more effectively recording information in system logs.

Referring to FIG. 5, one embodiment of a method 500 for more effectively recording information in system logs is illustrated. Such a method 500 may, in certain embodiments, be executed by the preprocessing module 302 previously discussed. This method 500 is presented by way of example an not limitation.

As shown, the method 500 initially determines 502 whether an error has occurred. If an error has occurred, the method 500 compares 504 the error with a hash map to determine if an error of that type has occurred before, how many times an error of that type has occurred before, timestamps associated with previous occurrences of the error, and the like. If an error of that type has not occurred before, the method 500 may insert 508 complete error information into a log file 306 and add 508 the error to the hash map based on its type.

If, at step 506, an error of that type has occurred before, the method 500 may increment 510 a count associated with the error type. The method 500 may also determine 512 whether the log file 306 has rolled over (i.e., started a new file). If not, the method 500 may add 514 a single line to the log file 306 indicating that the error has occurred and possibly include information such as a timestamp. This may reduce redundancy by eliminating duplicative information about the error. If the log has rolled over, the method 500 may insert 516 complete information (including, for example, traces such as stack traces) about the error into the log file 306.

At step 518, the method 500 may determine if the count associated with the error type exceeds a threshold. If the count exceeds the threshold, the method 500 sends 522 a notification to a user by way of, for example, a graphical user interface or a Call Home event. If the count does not exceed the threshold, the method 500 may do 520 nothing.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other implementations may not require all of the disclosed steps to achieve the desired functionality. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The invention claimed is:

1. A method for more effectively recording information in system logs, the method comprising:
   detecting a plurality of errors over a specified period of time;
   storing information associated with the plurality of errors in a memory buffer;
   preprocessing the information in the memory buffer to condense the information and remove duplication, wherein removing duplication comprises representing multiple instances of a specific type of error with a single instance, and providing a count indicating how many instances of the specific type of error the single instance represents; and
   determining whether the multiple instances of the specific type of error span multiple log files and, if so, providing the single instance in its entirety and the count in each of the multiple log files.

2. The method of claim 1, wherein detecting the plurality of errors comprises detecting the plurality of errors on at least one of a host system and a storage system.

3. The method of claim 1, wherein condensing the information comprises grouping the errors by error type.

4. The method of claim 3, wherein condensing the information comprises providing a single stack trace per error type.

5. The method of claim 1, wherein removing duplication further comprises providing a timestamp for each instance that the single instance represents.

6. The method of claim 1, further comprising notifying a user in the event the count reaches a threshold.

7. The method of claim 5, further comprising providing the timestamps in each of the multiple log files.

8. A computer program product for more effectively recording information in system logs, the computer program product comprising a computer-readable storage medium having computer-usable program code embodied therein, the computer-usable program code configured to perform the following when executed by at least one processor:
- detect a plurality of errors over a specified period of time;
- store information associated with the plurality of errors in a memory buffer;
- preprocess the information in the memory buffer to condense the information and remove duplication, wherein removing duplication comprises representing multiple instances of a specific type of error with a single instance, and providing a count indicating how many instances of the specific type of error the single instance represents; and
- determine whether the multiple instances of the specific type of error span multiple log files and, if so, providing the single instance in its entirety and the count in each of the multiple log files.

9. The computer program product of claim 8, wherein detecting the plurality of errors comprises detecting the plurality of errors on at least one of a host system and a storage system.

10. The computer program product of claim 8, wherein condensing the information comprises grouping the errors by error type.

11. The computer program product of claim 10, wherein condensing the information comprises providing a single stack trace per error type.

12. The computer program product of claim 8, wherein removing duplication further comprises providing a timestamp for each instance that the single instance represents.

13. The computer program product of claim 8, wherein the computer-usable program code is further configured to notify a user in the event the count reaches a threshold.

14. The computer program product of claim 12, wherein the computer-usable program code is further configured to provide the timestamps in each of the multiple log files.

15. A system for more effectively recording information in system logs, the system comprising:
- at least one processor; and
- at least one memory device operably coupled to the at least one processor and storing instructions for execution on the at least one processor, the instructions causing the at least one processor to:
  - detect a plurality of errors over a specified period of time;
  - store information associated with the plurality of errors in a memory buffer;
  - preprocess the information in the memory buffer to condense the information and remove duplication, wherein removing duplication comprises representing multiple instances of a specific type of error with a single instance, and providing a count indicating how many instances of the specific type of error the single instance represents; and
  - determine whether the multiple instances of the specific type of error span multiple log files and, if so, providing the single instance in its entirety and the count in each of the multiple log files.

16. The system of claim 15, wherein detecting the plurality of errors comprises detecting the plurality of errors on at least one of a host system and a storage system.

17. The system of claim 15, wherein condensing the information comprises grouping the errors by error type.

18. The system of claim 17, wherein condensing the information comprises providing a single stack trace per error type.

19. The system of claim 15, wherein removing duplication further comprises providing a timestamp for each instance that the single instance represents.

20. The system of claim 15, wherein the instructions further cause the at least one processor to notify a user in the event the count reaches a threshold.

* * * * *